US009845935B1

(12) United States Patent
Cheng et al.

(10) Patent No.: US 9,845,935 B1
(45) Date of Patent: *Dec. 19, 2017

(54) SOLID STATE DISK

(71) Applicant: ALSON TECHNOLOGY LIMITED, Kowloon OT (HK)

(72) Inventors: Han-Hung Cheng, Zhubei (TW); Chi-Fen Kuo, Zhubei (TW); Wei-Di Cheng, Zhubei (TW)

(73) Assignee: ALSON TECHNOLOGY LIMITED, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 15/188,238

(22) Filed: Jun. 21, 2016

(51) Int. Cl.
| | |
|---|---|
| *F21V 7/00* | (2006.01) |
| *F21V 3/00* | (2015.01) |
| *G11C 5/02* | (2006.01) |
| *F21Y 115/10* | (2016.01) |

(52) U.S. Cl.
CPC .............. *F21V 7/0008* (2013.01); *F21V 3/00* (2013.01); *G11C 5/02* (2013.01); *F21Y 2115/10* (2016.08)

(58) Field of Classification Search
CPC .......... G06F 1/181; G09F 13/00; G09F 13/04; G09F 13/22; G09F 23/00; F21V 23/0442; F21V 23/005; F21V 23/003; F21V 33/00; F21V 1/08; F21V 7/0008; F21V 3/00; G11C 5/02
See application file for complete search history.

(56) References Cited

U.S. PATENT DOCUMENTS

2014/0006603 A1* 1/2014 Yang ................... G06F 11/3034
709/224
2014/0372778 A1* 12/2014 Tian .................... G06F 13/4081
713/322

* cited by examiner

*Primary Examiner* — Thomas M Sember
(74) *Attorney, Agent, or Firm* — Muncy, Geissler, Olds & Lowe, P.C.

(57) ABSTRACT

A solid state disk is provided, including: a main body, including a shell portion, a substrate disposed on the shell portion and a memory module disposed on the substrate, the shell portion having a light-penetrable shell portion, the substrate having a light-penetrable portion and a first face, the substrate integrally formed with the light-penetrable portion, the first face having a first coating layer which has an emergent light-penetrable portion corresponding to the light-penetrable portion, the light-penetrable shell portion corresponding to the emergent light-penetrable portion, the substrate including a transmission port, the memory module electrically connected to the transmission port; a light-emitting portion, disposed on the main body and electrically connected to the transmission port, a light emitted from the light-emitting portion being penetrable through the light-penetrable portion and the emergent light-penetrable portion and via the light-penetrable shell portion to an exterior of the solid state disk.

9 Claims, 4 Drawing Sheets

SOLID STATE DISK

BACKGROUND OF THE INVENTION

Field of the Invention

The present invention relates to a solid state disk.

Description of the Prior Art

Conventionally, a solid state disk is provided with a light-emitting device like LED for reminding or decoration.

However, in the conventional solid state disk, a scattering structure needs to be provided additionally for making a light emitted from a light-emitting portion even. However, the scattering structure often occupies a lot of space, if the scattering structure is disposed on the substrate, the substrate becomes crowded, and a heat dissipation effect of a memory module on the substrate is influenced; if the scattering structure is not provided, it is hard for the light emitted from the light-emitting portion to create an evenness effect. In addition, the light-emitting device and the memory module are often disposed on a same face of the substrate, so the heat-dissipation effect is influenced.

The present invention has arisen to mitigate and/or obviate the afore-described disadvantages.

SUMMARY OF THE INVENTION

The major object of the present invention is to provide a solid state disk which can emit an even and soft light without a scattering structure and can create a comfortable visual effect.

To achieve the above and other objects, a solid state disk is provided, including: a main body, including a shell portion, a substrate which is disposed on the shell portion and a memory module which is disposed on the substrate, the shell portion having a light-penetrable shell portion, the substrate having a light-penetrable portion and a first face, the substrate integrally formed with the light-penetrable portion, the first face having a first coating layer, the first coating layer having an emergent light-penetrable portion corresponding to the light-penetrable portion, the light-penetrable shell portion corresponding to the emergent light-penetrable portion, the substrate including a transmission port, the memory module electrically connected to the transmission port; a light-emitting portion, disposed on the main body and electrically connected to the transmission port, a light emitted from the light-emitting portion being capable of being projected through the light-penetrable portion and the emergent light-penetrable portion and via the light-penetrable shell portion to an exterior of the solid state disk.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
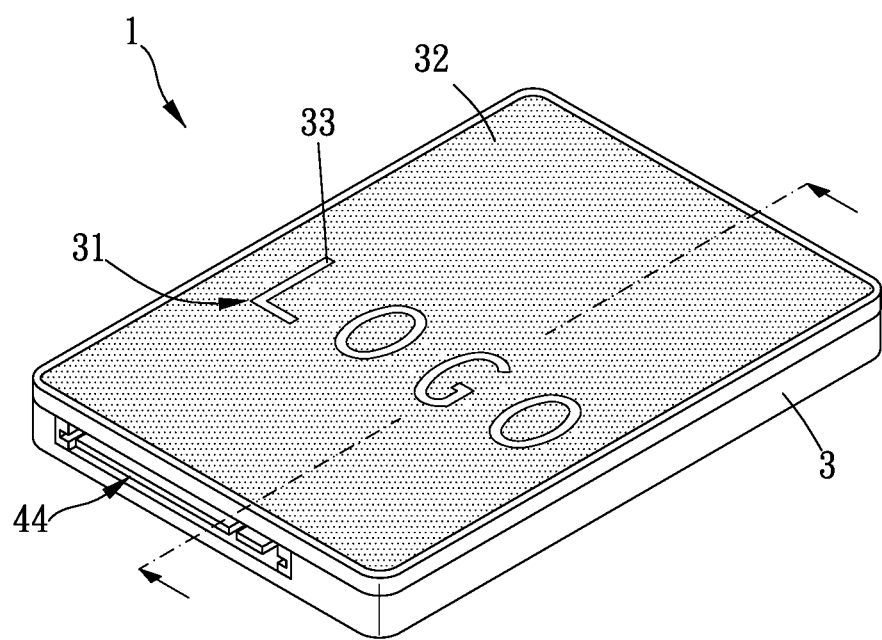
FIG. 1 is a stereogram of a preferred embodiment of the present invention.
Figure 2:
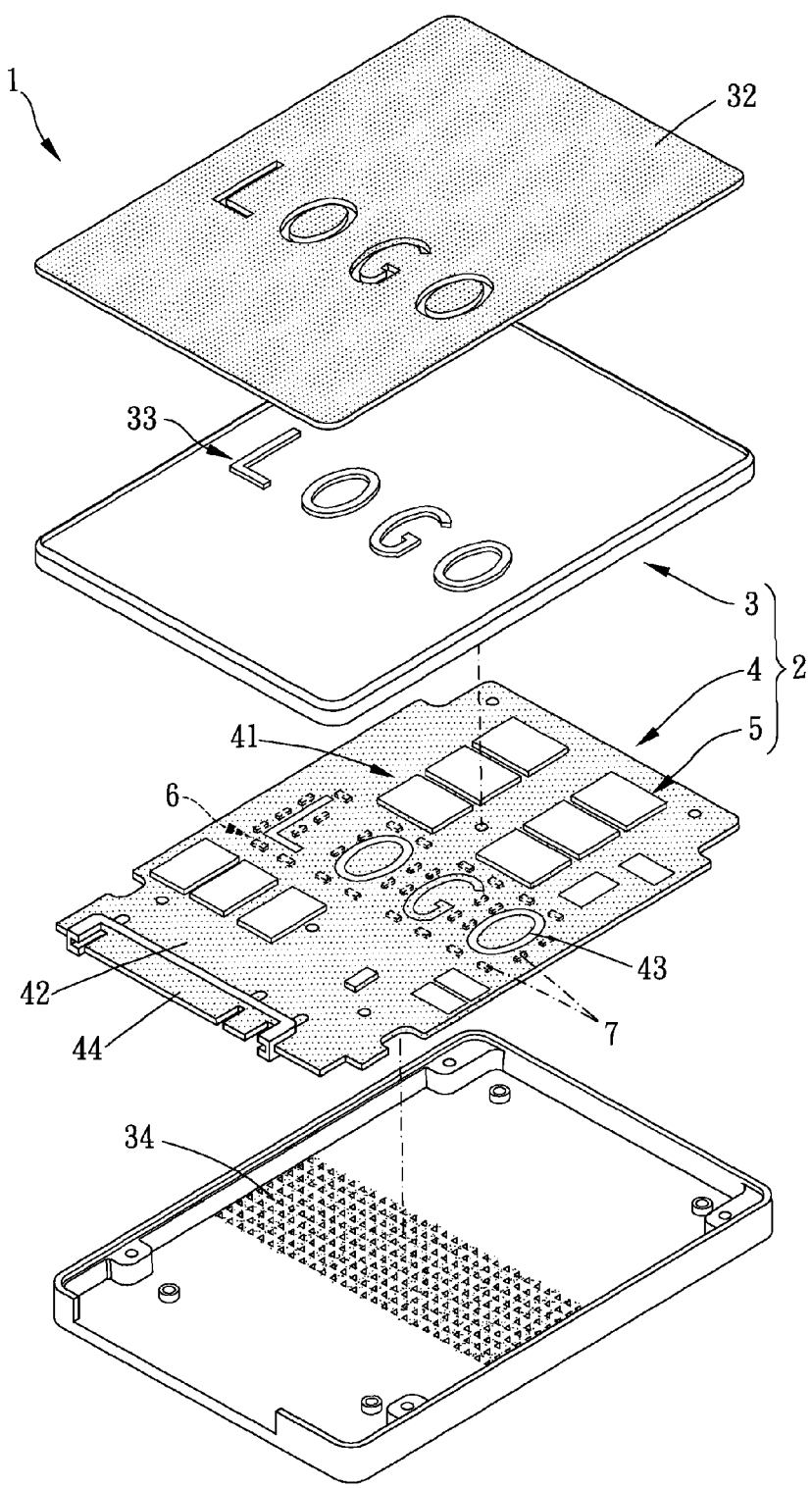
FIG. 2 is a breakdown view of the preferred embodiment of the present invention.
Figure 3:
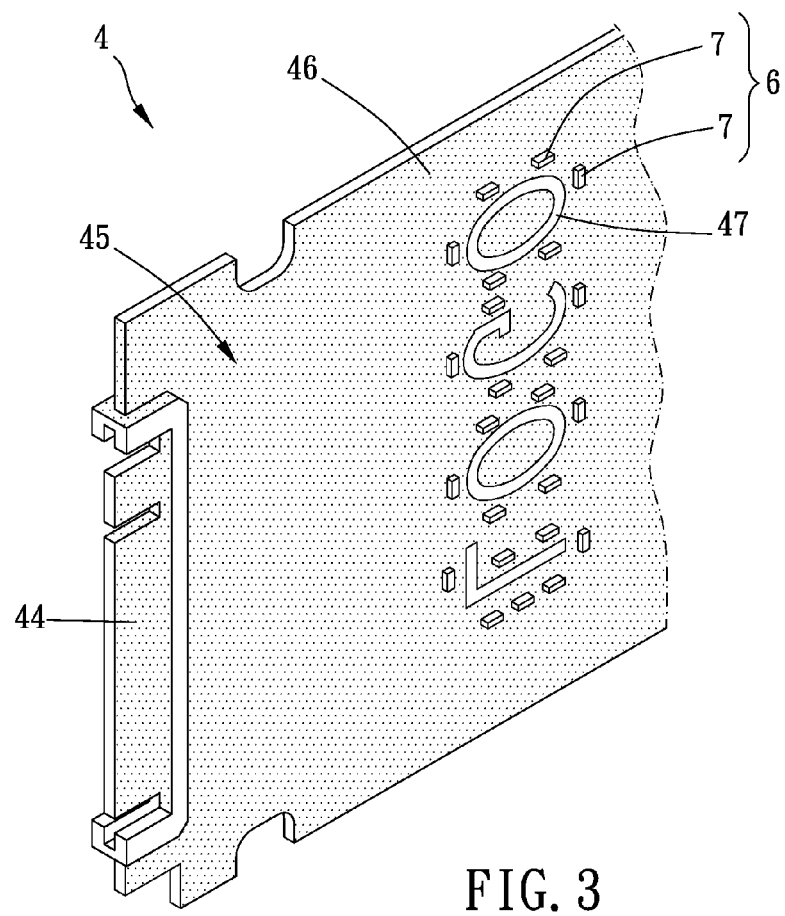
FIG. 3 is a partially-enlarged view of a substrate of the preferred embodiment of the present invention from another perspective.
Figure 4:
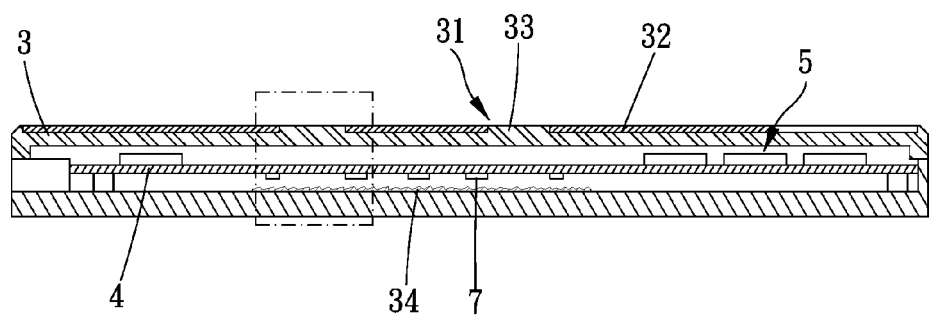
FIG. 4 is a cross-sectional side view of the preferred embodiment of the present invention.
Figure 5:
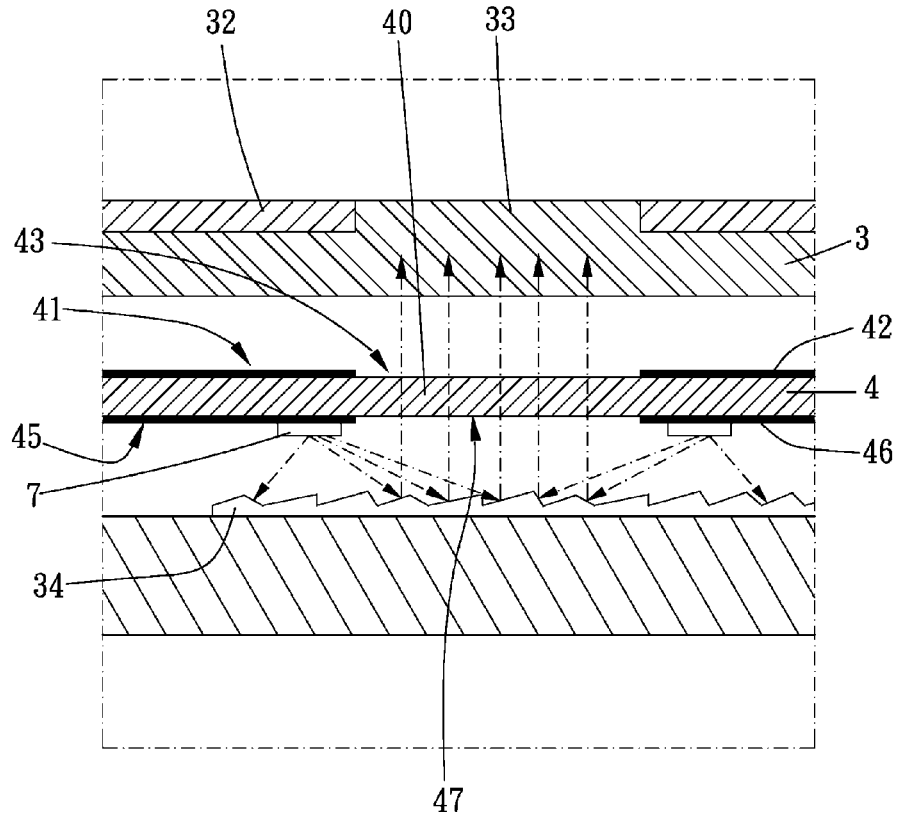
FIG. 5 is a partially-enlarged view of FIG. 4.
Figure 6:
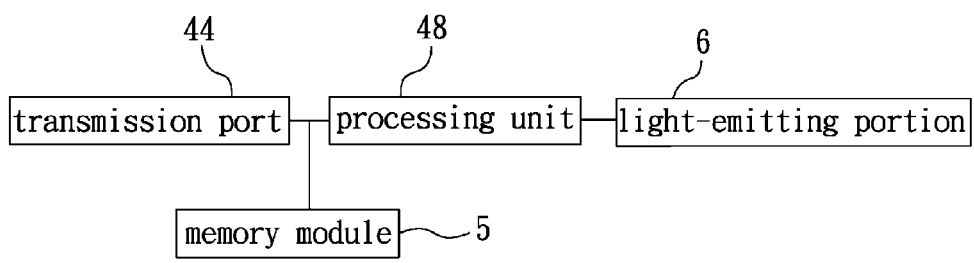
FIG. 6 is a diagram showing a structural relationship of the preferred embodiment of the present invention.

Please refer to FIGS. 1 to 6 for a preferred embodiment of the present invention. A solid state disk 1 includes a main body 2 and a light-emitting portion 6.

The main body 2 includes a shell portion 3, a substrate 4 which is disposed on the shell portion 3 and a memory module 5 which is disposed on the substrate 4, the shell portion 3 has a light-penetrable shell portion 31, the substrate 4 has a light-penetrable portion 40 and a first face 41, the substrate 4 is integrally formed with the light-penetrable portion 40, the first face 41 has a first coating layer 42 (preferably not light-penetrable), the first coating layer 42 has an emergent light-penetrable portion 43 corresponding to the light-penetrable portion 40, the light-penetrable shell portion 31 corresponds to the emergent light-penetrable portion 43, the substrate 4 includes a transmission port 44, and the memory module 5 is electrically connected to the transmission port 44. Specifically, the transmission port 44 can transmit not only electricity but also data. The light-emitting portion 6 is disposed on the main body 2 and electrically connected to the transmission port 44, and the light emitted from the light-emitting portion 6 can be projected through the light-penetrable portion 40 and the emergent light-penetrable portion 43 and via the light-penetrable portion 31 to an exterior of the solid state disk 1. Therefore, the light emitted from the light-emitting portion 6 can be weakened, evened and soften by the light-penetrable portion 40 and be projected out to present a comfortable visual effect (after a part of the coating layer on the substrate which carries a circuit is removed, a part of the substrate is light-penetrable (preferably the substrate is translucent) to create an evenness effect).

In this embodiment, the memory module 5 is disposed on the first face 41. The light-penetrable shell portion 31 includes a decoration plate 32 on the shell portion 3 and a light-penetrable pattern portion 33 (for example, a trademark) disposed on the decoration plate 32, the light-penetrable pattern portion 33 can add beauty to the solid state disk 1, and preferably, the light-penetrable pattern portion 33 may not be hollow-out and be a layer made of a transparent material (for example but not limited thereto, a light-penetrable glass) so as to prevent dust from entering an interior of the solid state disk 1. The substrate 4 further has a second face 45 opposite to the first face 41, the substrate 4 further includes a second coating layer 46 on the second face 45, the second coating layer 46 has an incident light-penetrable portion 47 corresponding to the light-penetrable portion 40, the light emitted from the light-emitting portion 6 is capable of being projected through the incident light-penetrable portion 47 to the light-penetrable portion 40, and the light-emitting portion 6 is disposed on the second face 45 of the substrate 4 and neighboring to the incident light-penetrable portion 47. The light-emitting portion 6 and the memory module 5 are arranged on two opposite sides of the substrate 4 to disperse heat conduction, and the light-emitting portion 6 and the memory module 5 can dissipate heat without disturbing each other. The light-emitting portion 6 includes a plurality of light-emitting diodes 7 which are disposed on the substrate 4 and substantially along a contour of the incident light-penetrable portion 47 so as to prevent the light projected from the light-penetrable shell portion 31 from being uneven, and the light-emitting diodes 7 can save electricity and emit light stably.

The shell portion 3 further includes a reflecting structure 34 corresponding to the light-emitting portion 6, the reflecting structure 34 reflects a part of the light emitted from the light-emitting portion 6 to the incident light-penetrable portion 47, the reflecting structure 34 is disposed on the shell portion 3 to prevent from occupying a space of the substrate 4, the reflecting structure 34 can make the light which has been reflected even, and the light-penetrable portion 40 and the reflecting structure 34 are for making the light emitted from the light-emitting portion 6 even twice to produce a preferable visual effect. It is to be noted that the emergent light-penetrable portion 43 and the light-penetrable pattern portion 33 correspond to each other in position and shape; therefore, in actual practice, as viewed from a side of the solid state disk 1 tiltedly, a user can see from the light-penetrable pattern portion 33 that the first coating layer 42 is located on an edge of a contour of the light-penetrable pattern portion 33 and form a light shading so as to create a gradient visual effect. The light-emitting portion 6 is emittable in any of at least two kinds of light in different colors so as to enrich the color variations of the solid state disk 1 and to produce a unique visual effect. The substrate 4 is further provided with a processing unit 48, the processing unit 48 is electrically connected to the light-emitting portion 6, and the light-emitting portion 6 is controllable by the processing unit 48 to create different light variations when the solid state disk 1 is in operation.

In other embodiments, the emergent light-penetrable portion and the light-penetrable pattern portion may not correspond to each other in position and shape; the shell portion may not have the decoration plate, the light-penetrable pattern portion may be directly disposed on the shell portion, or the shell portion and the decoration plate may be integrally formed; the light-penetrable pattern portion of the solid state disk may be a hollow-out structure; the substrate may further include other devices, for example (but not limited thereto), a special device like a transmission speed detection unit to increase the functionality of the solid state disk; the light-emitting portion may be disposed on the shell portion as long as the light emitted from the light-emitting portion can enter the light-penetrable portion through the incident light-penetrable portion; the light-emitting portion may also include other mechanisms which can provide light; the light-emitting portion may produce only one color of light; the solid state disk may not include the reflecting structure and make the light emitted from the light-emitting portion be projected into the light-penetrable portion directly; the memory module may be disposed on the first face or/and the second face.

Given the above, the light-penetrable portion of the solid state disk can emit an even and soft light, and the light-penetrable portion and the light-penetrable pattern portion of the solid state disk can provide a special visual effect. The reflecting structure is dispose on the shell portion so that the substrate is more concise.

While we have shown and described various embodiments in accordance with the present invention, it should be clear to those skilled in the art that further embodiments may be made without departing from the scope of the present invention.

What is claimed is:

1. A solid state disk, including:
a main body, including a shell portion, a substrate which is disposed on the shell portion and a memory module which is disposed on the substrate, the shell portion having a light-penetrable shell portion, the substrate having a light-penetrable portion and a first face, the substrate integrally formed with the light-penetrable portion, the first face having a first coating layer, the first coating layer having an emergent light-penetrable portion corresponding to the light-penetrable portion, the light-penetrable shell portion corresponding to the emergent light-penetrable portion, the substrate including a transmission port, the memory module electrically connected to the transmission port;
a light-emitting portion, disposed on the main body and electrically connected to the transmission port, a light emitted from the light-emitting portion being capable of being projected through the light-penetrable portion and the emergent light-penetrable portion and via the light-penetrable shell portion to an exterior of the solid state disk.

2. The solid state disk of claim 1, wherein the light-penetrable shell portion includes a decoration plate on the shell portion and a light-penetrable pattern portion disposed on the decoration plate.

3. The solid state disk of claim 1, wherein the substrate further has a second face opposite to the first face, the substrate further includes a second coating layer on the second face, the second coating layer has an incident light-penetrable portion corresponding to the light-penetrable portion, the light emitted from the light-emitting portion is capable of being projected through the incident light-penetrable portion to the light-penetrable portion, and the light-emitting portion is disposed on the substrate and neighboring to the incident light-penetrable portion.

4. The solid state disk of claim 3, wherein the light-emitting portion includes a plurality of light-emitting diodes which are disposed on the substrate and substantially along a contour of the incident light-penetrable portion.

5. The solid state disk of claim 3, wherein the shell portion further includes a reflecting structure corresponding to the light-emitting portion, and the reflecting structure reflects a part of the light emitted from the light-emitting portion to the incident light-penetrable portion.

6. The solid state disk of claim 1, wherein the emergent light-penetrable portion and the light-penetrable pattern portion correspond to each other in position and shape.

7. The solid state disk of claim 1, wherein the light-emitting portion is emittable in any of at least two kinds of light in different colors.

8. The solid state disk of claim 1, wherein the substrate is further provided with a processing unit, the processing unit is electrically connected to the light-emitting portion, and the light-emitting portion is controllable by the processing unit.

9. The solid state disk of claim 1, wherein the light-penetrable shell portion includes a decoration plate on the shell portion and a light-penetrable pattern portion disposed on the decoration plate; the substrate further has a second face opposite to the first face, the substrate further includes a second coating layer on the second face, the second coating layer has an incident light-penetrable portion corresponding to the light-penetrable portion, the light emitted from the light-emitting portion is capable of being projected through the incident light-penetrable portion to the light-penetrable portion, the light-emitting portion is disposed on the substrate and neighboring to the incident light-penetrable portion; the light-emitting portion includes a plurality of light-emitting diodes which are disposed on the substrate and substantially along a contour of the incident light-penetrable portion; the shell portion further includes a reflecting structure corresponding to the light-emitting portion, and the reflecting structure reflects a part of the light emitted from the light-emitting portion to the incident light-penetrable portion; the emergent light-penetrable portion and the light-penetrable pattern portion correspond to each other in position and shape; the light-emitting portion is emittable in any of at least two kinds of light in different colors; the substrate is further provided with a processing unit, the processing unit is electrically connected to the light-emitting portion, and the light-emitting portion is controllable by the processing unit.

* * * * *